United States Patent [19]

Kadomura et al.

[11] Patent Number: 5,320,708

[45] Date of Patent: Jun. 14, 1994

[54] DRY ETCHING METHOD

[75] Inventors: Shingo Kadomura; Masakazu Muroyama, both of Kanagawa, Japan

[73] Assignee: Sony Corporation, Tokyo, Japan

[21] Appl. No.: 825,279

[22] Filed: Jan. 24, 1992

[30] Foreign Application Priority Data

Jan. 25, 1991 [JP] Japan .................. 3-025568

[51] Int. Cl.$^5$ ............................. H01L 21/00
[52] U.S. Cl. ................... 156/662; 156/643; 156/646; 156/653; 156/656; 156/657
[58] Field of Search ............... 156/662, 643, 646, 653, 156/651, 656, 657, 655

[56] References Cited

U.S. PATENT DOCUMENTS 4,985,114  1/1991  Okudaira et al. ............... 437/228
4,992,137  2/1991  Cathey et al. .................. 156/646

FOREIGN PATENT DOCUMENTS 62-293619  12/1987  Japan .
63-050021   3/1988  Japan .
01-032627   2/1989  Japan .
01-292841  11/1989  Japan .

OTHER PUBLICATIONS

"D.C. Plasma Etching of Silicon By Sulfur Hexafluoride"; Wagner et. al.; Plasma Chem. Plasma Process; 1(2); abstract.

Primary Examiner—Brian E. Hearn
Assistant Examiner—George Goudreau
Attorney, Agent, or Firm—Hill, Steadman & Simpson

[57] ABSTRACT

A dry etching method by which the surface of a variety of materials constituting a semiconductor device may be planarized or smoothed under clean state. Small-sized recesses existing on the surface of a layer of the material to be etched are filled with deposited free sulfur yielded from sulfur halides, such as $S_2F_2$ or $S_2Cl_2$, into the plasma under conditions of dissociation produced by electrical discharge. After the surface of the material to be etched is planarized in this manner, etching is carried out under conditions of simultaneously removing the small-sized projections and deposited sulfur to successfully eliminate step differences or roughness on the material surface. Etching may alternatively be carried out under the condition of competition of filling of recesses with sulfur and removal of the projections. Sulfur may easily be removed on sublimation by heating the wafer after completion of etching without producing pollution by particles. The present invention may be applied to trimming of cross-sectional shape of the trenches or connection holes, surface smoothing of the $WSi_x$ layer formed by high temperature CVD or planarization of an interlayer insulating film used for covering the step differences.

8 Claims, 5 Drawing Sheets

FIG. 8d

DRY ETCHING METHOD

BACKGROUND OF THE INVENTION

1. Field of the Invention

This invention relates to a dry etching method employed for the preparation of a semiconductor device. More particularly, it relates to a method for planarizing minute irregularities or steps produced on the surface of a silicon based or silicon oxide based material.

2. Description of Related Art

In keeping up with the recent tendency towards high integration and high performance of semiconductor devices, such as VLSIs or ULSIs, more and more strict technical demands have been raised on various preparation processes. Above all, in the field of dry etching, various effects which have not been produced under the former design rule have come to the surface, whilst minute surface irregularities or steps, which have been neglected as being not worthy of note, have been found to affect the process. For example, new problems have been raised in connection with unusual contours produced at the bottom of contact holes or trenches, deteriorations in the surface morphology of layers of a variety of materials or planarities of interlayer insulating films in multi-level interconnections. These will be discussed in sequence.

The first problem of unusual contours in contact holes or at the trench bottom has been presented as a counter-effect of the measures taken for preventing microloading effects. The microloading effects means a phenomenon in which, when there exist plural apertures of different diameters on a substrate, the etching rate is diminished significantly in smaller apertures. The conventional practice for reducing the phenomenon is to lower the gas pressure during etching. In this manner, the mean free path of the ions is extended to increase the energy of incident energy as well as the vertically incident component to lower the aperture diameter dependency of the etching rate.

However, with the etching under reduced gas pressure, an unusual cross-sectional shape known as trenching tends to be produced. This trenching is a phenomenon in which an incision known as a sub-trench is apt to be produced at a corner of the trench which is formed by etching the single crystal silicon substrate by means of an etching mask formed of a silicon oxide layer. Although the mechanism of trenching is not known precisely, it is possibly ascribable to the presence of ions which are incident from an oblique direction due to scattering at an edge of a mask which has become receded under ion sputtering, to a deposition of etching by-products to an increased thickness at the middle of the trench bottom, and to an increased etching rate in the vicinity of the sidewall on which the amount of the deposit is small due to the increased vertically incident component thereon under a low gas pressure. If the processes of element isolation or formation of capacitor elements are to be initiated at this stage, various inconveniences would be produced, such as lattice defects within the single crystal silicon substrates during the annealing process.

Similar trenching may be produced when forming contact holes by etching a silicon oxide interlayer insulating film with a single crystal substrate as an underlying layer. If overetching should be performed in this state, the contour of the sub-trench produced at the contact hole would be reflected in the underlying single crystal silicon substrate, so that lattice defects or the like again tend to be produced.

The present Assignee has hitherto proposed techniques for trimming the trenching.

As to silicon trench etching, there is disclosed in JP Patent KOKAI Publication No. 63/491 (1988) a technique of etching a silicon substrate, using a chlorine-based gas, such as $Cl_2$, to a depth slightly less than a desired depth, and etching to the desired depth using a gas which is the above mentioned chlorine-based gas with an addition of a deposition gas, such as $CH_2F_2$. According to this technique, the bottom surface of the trench may be planarized because etching proceed competitively whilst the sub-trench is protected by a carbonaceous polymer.

On the other hand, as to etching of a contact hole, there has recently been proposed a technique of etching a silicon oxide interlayer insulating film, using a gas composed essentially of a compound enabling a ion mode etching, such as $C_3F_8$, to a point slightly before the underlying layer is exposed, allowing the carbonaceous polymer to be deposited in the sub-trench using a deposition gas such as $CH_2F_2$, and then etching the carbonaceous polymer and the remaining portion of the silicon oxide interlayer insulating film using $CHF_3$. Alternatively, deposition of the carbonaceous polymer and the etching of the silicon oxide interlayer insulating film may be caused to proceed competitively, even if $CHF_3$ is used alone from the outset, subject to certain minor changes of the operating conditions.

The second problem is deterioration of the surface morphology of the layers of various materials, and is presented when forming, for example, a layer of refractory metal silicide by high temperature CVD. The layer of the refractory metal silicide has been used extensively in recent years as a gate electrode material in the form of a stacked layer with a doped polysilicon layer. Typical of the refractory metal silicide layer is a tungsten silicide ($WSi_x$) layer making use of tungsten as refractory metal.

The method for forming the $WSi_x$ layer may be roughly classified into a low temperature CVD method and a high temperature CVD method. The low temperature CVD method is a technique of allowing $WSi_x$ to be deposited by a mixed gas of $SiH_4$ and $WF_6$ for example while maintaining the wafer temperature of approximately 360° C. The high temperature CVD method is a technique of allowing $WSi_x$ to be deposited by a mixed gas of $SiH_2Cl_2$ and $WF_6$ for example while maintaining the wafer temperature of approximately 600° C. As compared to the low temperature CVD method, the high temperature CVD method has such advantages that the produced $WSi_x$ layer is low in the fluorine content and exhibits strong adhesion properties with respect to the underlying doped polysilicon layer and superior step coverage as well as lesser temperature dependency of the internal stress.

However, the $WSi_x$ layer produced by the high temperature CVD method suffers from rather severe surface irregularities, as will be discussed subsequently. Since $WSi_x$ is naturally deposited during the high temperature CVD process on an alignment mark used for photomask position matching, it becomes difficult to detect the reflected light. Besides, the photoresist layer exhibits nonuniform thickness on such a $WSi_x$ layer, so that accuracy in photolithgraphy may be lowered. If the $WSi_x$ layer is etched with the severe surface irregularities remaining intact, the subsequent operating steps may be affected due to, for example, transfer of the surface irregularities onto the surface of the underlying layer.

Deterioration in the surface morphology presents problems not only in the WSi$_x$ layer produced by the above mentioned CVD method, but also in trench sidewalls used for forming capacitative elements or in polysilicon layers used for forming gate electrodes of PMOS transistors functioning as load resistor elements for SRAMs. In these cases, if the surface irregularities are left unattended, the oxide film formed thereon tends to be non-uniform and to lower the voltage resistance. Planarization is a desideratum in a large number of material layers in the preparation of semiconductor devices, and several techniques to meet the demands have been proposed.

For example, in Extended Abstracts of the 35th Sprlng Meeting (1988) of the Japan Society of Applied Physics and Related Societies, page 498, lecture number 28p-G-2, a report has been made of a technique of etching a previously trenched silicon substrate in a downflow type chemical dry etching device, using a mixed gas of CF$_4$ and O$_2$, for rounding trench corners and smoothing sidewall roughnesses for improving the voltage resistance of the oxide film.

Also, in Extended Abstracts of the 35th Spring Meeting (1989) of the Japan Society of Applied Physics and Related Societies, page 572, lecture number 1p-L-8, a report has been made of a technique of smoothing a polysilicon layer by a similar gas system. In this case, the voltage resistance of the oxide film produced by surface oxidation of polysilicon is improved significantly.

In these techniques, O$_2$ is used in excess relative to CF$_4$ for yielding a silicon oxyfluoride Si$_x$F$_y$O$_z$ and the silicon substrate or the polysilicon layer is smoothed by competitive processes of Si$_x$F$_y$O$_z$ deposition and etching reactions. It is premeditated that such smoothing is realized by a mechanism in which the vapor pressure of Si$_x$F$_y$O$_x$ ls low on a surface of negative curvature such as trench corners or surface recesses to suppress etching to favor deposition while the vapor pressure of Si$_x$F$_y$O$_z$ is high on a surface of positive curvature such as surface projections to favor etching rather than deposition.

The third problem is insufficient planarity of the interlayer insulating film. In keeping up with the accelerated progress in recent years to higher integration and higher density of semiconductor devices, an increasing area tends to be taken up by interconnections on a device chip so that multi-level interconnections are becoming indispensable for preventing a chip area from being increased. Hence, planarization of the interlayer insulating film has become more crucial for maintaining processing accuracy and step coverage of the interconnection layer in the course of the subsequent processing steps.

The commonplace practice in planarizing the interlayer insulating film has been to form a planar layer of a resist material on the surface of the interlayer insulating film and to etch back the layer of the resist material and the interlayer insulating film at an equal etchrate.

In an Extract of VLSI Multilevel Interconnection Conference (1989) pages 89 to 98, there is disclosed a method of planarizing the substrate by a B$_2$O$_3$ planarizing film followed by etchback at an equal etchrate. The planarizing film may be produced in an extremely planar state by introducing trimethyl borate B(OCH$_3$)$_3$, a liquid substance at ambient temperature, into a plasma CVD device, along with O$_2$, to then al low B$_2$O$_3$ to flow and be precipitated on the wafer surface with the wafer temperature of 390° to 480° C.

There is also proposed a technique of coating the interlayer insulating film with a low molecular weight styrene-chloromethylstyrene polymer solution to planarize the substrate surface to effect etchback at an equal etching rate after the drying and cross-linking steps.

Although demands have been raised for planarization and smoothing for the preparation of semiconductor devices, the conventional techniques leave much to be desired.

In the technique of allowing the carbonaceous polymer to be deposited for trimming the trench, the polymer is deposited on any components present in an etching chamber at the same time that it is deposited on a substrate, so that the risk of pollution by particles is increased. Above all, when processing a number of wafers one by one, higher levels of pollution by particles are encountered with the progress of the processing operations.

The technique of allowing Si$_x$F$_y$O$_z$ to be deposited for improving the surface morphology is similarly not exempt from the problem of pollution by particles.

With the technique of planarizing the interlayer insulating film by B$_2$O$_3$, meticulous attention needs to be exercised in controlling the atmosphere within the etching device to complicate the operation because of the high hygroscopicity of B$_2$O$_3$ and the high softening point thereof which is as high as about 460° C. If the metal interconnection is of aluminum, the interconnection may be deteriorated. If a styrene-chlorostyrene polymer is used, pollution tends to be produced during drying and crosslinking, while the throughput may also be lowered.

OBJECT AND SUMMARY OF THE INVENTION

It is therefore an object of the present invention to overcome the above mentioned problems and to provide a dry etching method whereby micro-sized surface roughnesses produced on surfaces of a variety of materials or step differences may be eliminated under clean states to assure high smoothness and planarity.

In consideration that pollution by particles represents a major obstacle to smoothing or planarizing techniques, the present inventors have thought of using a deposition material which would not become a source of particles, and directed their attention to sulfur (S) which may be removed easily with sublimation by heating to a lower temperature. The etching gas needs to contain both sulfur and element(s) capable of yielding an etchant. Among the materials thought to be useful in this respect are four sulfur fluorides namely S$_2$F$_2$, SF$_2$, SF$_4$ and S$_2$F$_{10}$, and three sulfur chlorides, S$_3$Cl$_2$, S$_2$Cl$_2$ and SCl$_2$. Besides the above mentioned four sulfur fluorides, SF$_6$ has also been known as a stable compound and put to practical application as a gas for dry etching. This compound, however, is not suited for the purpose of the present invention because a large quantity of F* radicals are produced due to the high F/S ratio (the ratio of the number of fluorine atoms to that of sulfur atoms in a molecule) and sulfur is scarcely produced on discharge dissociation.

Both the sulfur fluorides and the sulfur chlorides are capable of yielding sulfur in the plasma on discharge dissociation. Sulfur thus yielded may be easily precipitated on the wafer surface, depending on the operating conditions, if the wafer is cooled to a temperature lower than ambient temperature. Sulfur deposition may occur in preference to etching in the sub-trench occured in the corners of contact holes or trenches, or on surfaces recesses presenting negative curvature. Conversely, etching may occur in preference to sulfur deposition, on mid parts of the contact hole bottom or the trench bottom, or on surfaces projections presenting positive curvature. It is by such a mechanism that the etchrates are averaged on the entire etching surface to provide for smoothing or planariation.

In the above described basic concept of the present invention, a point of difference, if any, in the particular etching mechanisms is whether deposition of sulfur and etching of the layer to be etched occur competitively under the same conditions, or independently under different conditions.

In the former case, the process of preferential sulfur deposition in surface recesses and the process of etching of surface projections of the layer to be etched proceed simultaneously. Although sulfur is also naturally adsorbed on the surface projections, it is immediately eliminated without being deposited because of the higher possibility of the incidence of the etchants thereat. The result is that etching may proceed at an averaged etching rate, as far as the entire etching surface is concerned, while protection of the surface recesses is assured.

In the latter case, after the sulfur is deposited in the first step, and the substrate is once smoothed or planarized, etching is performed in the second step under conditions in which the surface projections and the deposited sulfur are etched at the same etchrate.

In these cases, any residual sulfur deposits may be easily removed on sublimation by heating or plasma processing of the substrate after completion of the etching, without the least risk of pollution by particles.

In this manner, the present invention provides for smoothing or planarizing any kind of surface irregularities ranging from minor irregularities on the layers of materials produced by vacuum thin film forming techniques to minor step differences produced on the surface of the interlayer insulating films. Thus the present invention is highly useful in the preparation of semiconductor devices designed in accordance with highly refined design rule and exhibiting high integration and high performance.

BRIEF DESCRIPTION OF THE DRAWINGS

FIGS. 6a to 6c are schematic cross-sectional views showing an example of application of the present invention to trench etching, step by step, wherein FIG. 6a shows the state in which trenching has occurred on the bottom in the course of formation of a trench, FIG. 6b shows the state in which sulfur has been deposited in the sub-trench and FIG. 6c shows the state in which the trench bottom has been trimmed.

FIGS. 7a to 7c are schematic cross-sectional views showing an example of application of the present invention to smoothing of surface irregularities, step by step, wherein FIG. 7a shows the state of a wafer prior to etching, FIG. 7b shows the state in which sulfur deposition in the surface recesses and etching off of surface projections proceed simultaneously, FIG. 7c shows the state in which sulfur has been deposited on the entire surface of the $WS_{ix}$ layer near the end point of the etching, and FIG. 7d shows the state in which the deposit has been removed by sublimation.

FIGS. 8a to 8d are schematic cross-sectional views showing an example of application of the present invention to smoothing of surface step differences, step by step, wherein FIG. 8a shows the state of a wafer prior to etching, FIG. 8b shows the state in which sulfur has been deposited in the step recesses, FIG. 8c shows the state in which the second interlayer insulating film has been planarized and FIG. 8d shows the state in which a third interlayer insulating film has been stacked.

DETAILED DESCRIPTION OF THE INVENTION

The present invention will be hereinafter explained by referring to Examples in connection with the drawings.

EXAMPLE 1

In the present example, the present invention is applied to processing of a contact hole, and a trenching produced by etching of a silicon oxide interlayer insulating film is trimmed by simultaneous sulfur deposition and etching of the interlayer insulating film using $S_2F_2$. This process is explained by referring to FIGS. 1 to 5.

Figure 1:
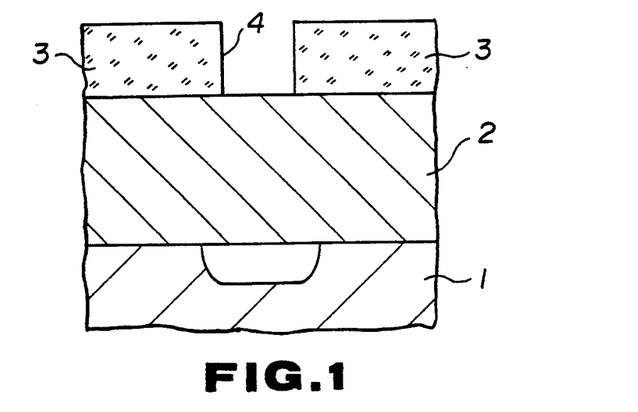
FIG. 1 is a schematic cross-sectional view showing an example of application of the present invention to processing of a contact hole, wherein the state of a wafer prior to etching is shown.

A wafer composed of a single crystal silicon substrate 1, on which a silicon oxide interlayer insulating film 2 is deposited such as by CVD and a resist mask 3 is then formed thereon, as shown in FIG. 1, was first prepared. An aperture 4 of 0.35 μm diameter was previously formed in the resist mask 3 by excimer laser lithography and development.

The wafer was set on a magnetic microwave plasma etching device and the insulating film 2 was etched to about 90% of its film thickness under the conditions of the $C_3F_8$ flow rate of 50 SCCM, a gas pressure of 0.67 Pa (5 mTorr), a microwave power of 850 W and an RF bias power of 200 W (13.56 MHz).

Figure 2:
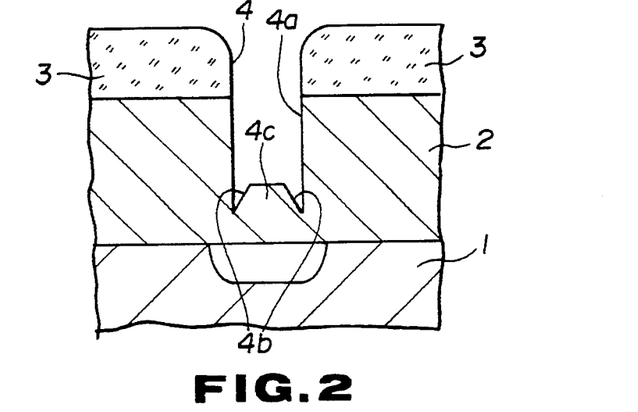
FIG. 2 is a schematic cross-sectional view showing the state in which, following the state shown in FIG. 1, trenching has been produced in the course of formation of the contact hole.

These etching conditions were selected so that $CF_x^+$ was produced as a main etchant in the plasma on dissociation by electrical discharge so that high anisotropy could be attained by application of a high bias voltage under a low gas pressure. The etching reaction proceeded mainly on the basis of an ion assist reaction, and a contact hole 4a having a substantially perpendicular sidewall was formed about halfway, as shown in FIG. 2. However, a sub-trench 4b was formed at the corner so that so-called trenching occurred. This trenching is produced due for example, in scattering at an edge of the resist mask 3 receded by ion irradiation. The etching depth is limited to about 90% of the film thickness in order to prevent the end of the sub-trench 4b from reaching the underlying single crystal silicon substrate 1 in anticipation of occurrence of such trenching. A bottom projection 4c was simultaneously formed at the mid part of the bottom.

Figure 3:
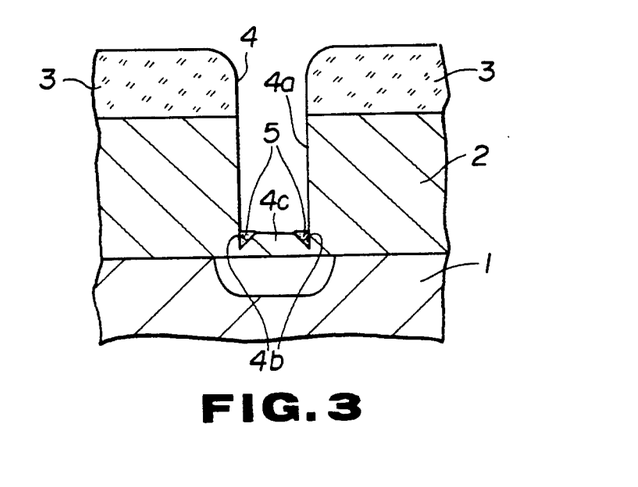
FIG. 3 is a schematic cross-sectional view showing the state in which, following the state shown in FIG. 2, sulfur has been deposited in a sub-trench.
Figure 4:
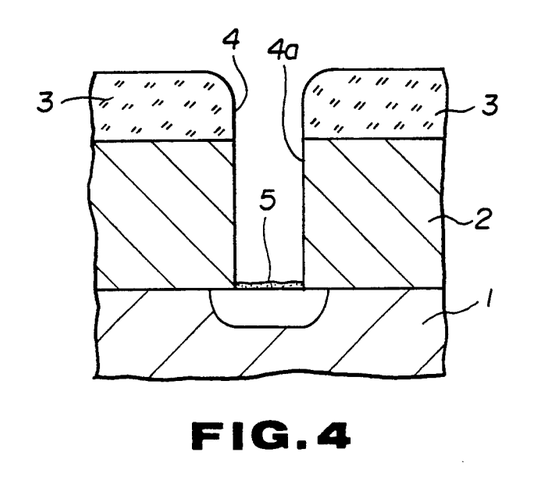
FIG. 4 is a schematic cross-sectional view showing the state in which, following the state shown in FIG. 3, sulfur has been deposited on the bottom of the contact hole near the etching end point.
Figure 5:
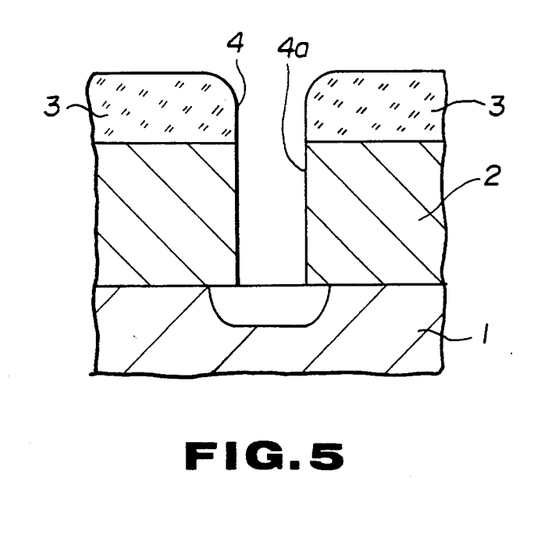
FIG. 5 is a schematic cross-sectional view showing the state in which, following the state shown in FIG. 4, sulfur deposited on the contact hole bottom has been removed.

For trimming the bottom shape of the contact hole 4a, produced during trenching, the wafer was cooled to about −70° C. by circulating a cooling medium, such as ethanol, through a cooling conduit enclosed within the wafer setting electrode. The remaining etching was carried out under the conditions of the $S_2F_2$ flow rate of 5 SCCM, an $H_2$ flow rate of 30 SCCM, a gas pressure of 1.3 Pa (10 mTorr), a microwave power of 850 W and an RF bias power of 300 W (400 kHz). Under these conditions, sulfur yielded in the plasma on dissociation by electrical discharge from $S_2F_2$ is adsorbed on the cooled wafer surface. However, since the amount of the incident active species is larger on the bottom projection 4c than on the remaining portions of the bottom of the contact hole 4a, the adsorbed sulfur is immediately removed under the action of $SF_x^+$ and $F^*$. On the other hand, since the amount of active species incident on peripheral portions is diminished under so-called shadow effects, a sulfur deposit layer 5 is formed in a sub-trench 4b. As a result, as shown in FIG. 3, etching proceeded while a planar surface was maintained at all times on the bottom of the contact hole 4a. A sulfur deposit layer 5 was also formed on the bottom of the contact hole 4a near the end point of the etching, as shown in FIG. 4.

The sulfur deposit layer 5 was easily removed on heating the wafer to about 90° C. after completion of the etching without producing pollution by the particles within the etching chamber. Heating at this time was not intended solely for removing sulfur by sublimation, but was simultaneously intended for preventing dewing on the wafer after the low temperature etching. Although the sulfur deposit layer 5 may be removed at an acceptable level by this heating, oxygen plasma ashing is subsequently performed for removing the resist mask 3 so that the layer 5 may be removed completely. The contact hole 4a having a satisfactory cross-sectional shape was produced.

Meanwhile, $H_2$ was added among the above conditions for effectively depositing sulfur for improving selectivity against the single crystal silicon substrate 1. Although $S_2F_2$ generates $F^*$ and hence is likely to deteriorate underlying layer selectivity, it has the lowest F/S ratio among the sulfur fluorides. Since the F/S ratio cannot be lowered further as far as $S_2F_2$ is used unmixed, $H_2$ is added to yield $H^*$ in the plasma to capture excess $F^*$ to remove them out of the system as hydrogen fluoride HF to lower the apparent F/S ratio to create the conditions which will favor the sulfur deposition. Therefore, in place of $H_2$, $H_2S$ or silane based gases may be used as addition gases, since these are capable of producing chemical species capable of capturing excess $F^*$. If $H_2S$ gas is used, sulfur may be supplied also from the addition gas to enhance the F/S ratio reducing effect. If the silane-based gas is used, since the silicon active species are also capable of capturing excess $F^*$ for removal thereof in the form of $SiF_x$, the F/S diminishing effect is similarly enhanced.

It is noted that rare gases, such as He or Ar, may also be added to the etching gas in expectation of the sputtering effects, cooling effects or dilution effects proper to these rare gases.

EXAMPLE 2

In this example, the present invention was applied to trench etching and a sub-trench produced on etching a single crystal silicon substrate was trimmed by a dual-step process consisting of a first step of depositing sulfur using $S_2Cl_2$ and a second step of etching the single crystal silicon substrate using $SF_6$. This process will be explained by referring to FIGS. 6a to 6c.

Figure 6A:
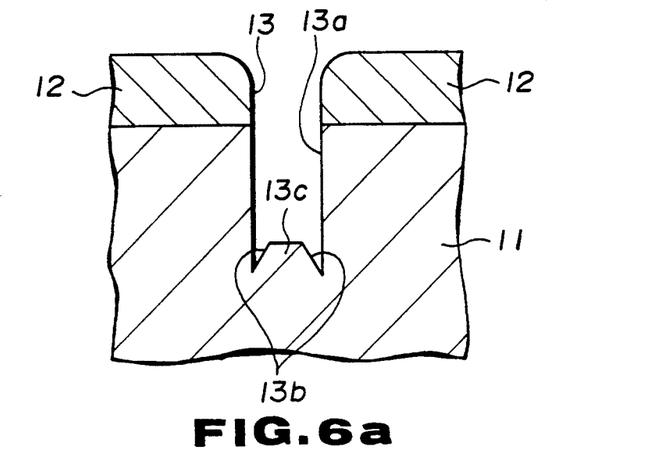

Referring to FIG. 6a, a silicon oxide etching mask 12 was formed on a single crystal silicon substrate 11, and etching of the single crystal silicon substrate 11 was carried out halfway by means of an aperture 13 of 0.5 μm diameter formed in the etching mask 12 using a magnetic microwave plasma etching device under the conditions of the $Cl_2$ flow rate of 40 SCCM, an $N_2$ flow rate of 20 SCCM, a gas pressure of 1.3 Pa (10 mTorr), a microwave power of 850 W and an RF bias power of 200 W (13.56 MHz). During this process, etching of the single crystal silicon substrate 11 proceeded mainly on the basis of an ion assist reaction by $Cl^+$ or $Cl_2^+$ so that a trench 13a having a perpendicular wall was produced about halfway. However, a sub-trench 13b was produced at the corner. This is ascribable to the fact that a part of the etching reaction product $SiCl_x$ reacts with $N_2$, added to the etching gas, to produce $SiCl_xN_y$, $SiN_x$ and so forth, and that these products deposit to a larger thickness at the center of the trench bottom to relatively increase the etchrate at the corner portion. In this process, a bottom projection 13c was formed in the mid of the trench bottom.

Figure 6B:
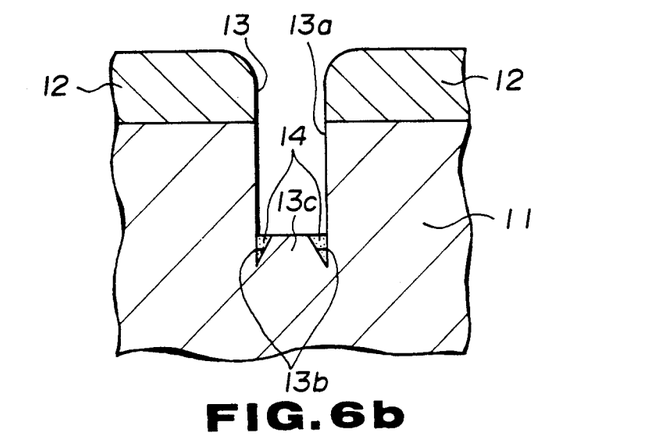

Then, for depositing sulfur in the sub-trench 13b, the wafer was cooled to about −70° C. and microwave discharging was carried out under the conditions of the $S_2F_2$ flow rate of 30 SCCM, an $H_2$ flow rate of 30 SCCM, a gas pressure of 1.3 Pa (10 mTorr), a microwave power of 850 W and an RF bias power of 0 W. It is noted that $H_2$ was added for diminishing the apparent F/S ratio of the etching system, while zero bias rollage was applied for suppressing ion sputtering for enabling effective sulfur deposition. As a result, a deposited sulfur layer 14 derived from $S_2Cl_2$ on dissociation by electrical discharge was formed in the sub-trench 13b for substantially planarizing the bottom surface of the trench 13a.

Although $S_2Cl_2$ was used in the step of forming the sulfur deposit layer 14, $S_2F_2$ may also be used in its stead under the same conditions for achieving similar results.

Figure 6C:
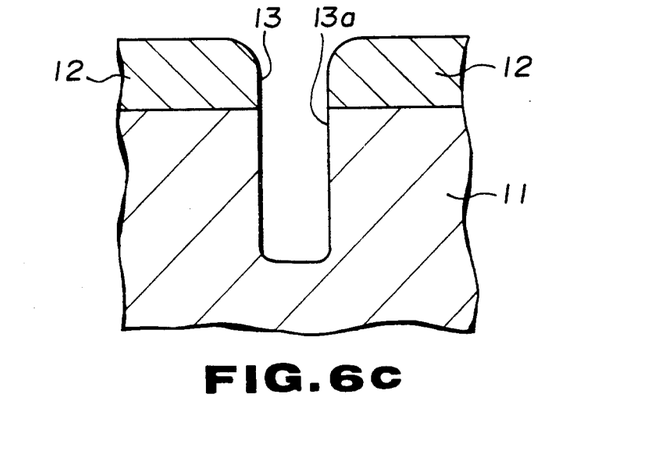

Then, for trimming the trench 13a, the remaining portion of etching was carried out under the conditions of the $SF_6$ flow rate of 10 SCCM, an Ar flow rate of 40 SCCM, a gas pressure of 1.3 Pa (10 mTorr), a microwave power of 850 W and an RF bias power of 30 W (13.56 MHz). During this process, etching of the bottom projection 13c proceeded in such a manner that $F^*$ yielded from $SF_6$ was assisted by $Ar^+$ while the etch rate was relatively lowered due to the presence of the sulfur deposit layer 14 at the corners and to the shadow effects, so that a trench 13a having rounded corners 13a as shown in FIG. 6c was produced. Rounding of the bottom in this manner is favorable in improving coverage of the oxide film deposited on the surface when forming a capacitative element using the trench 13a for thereby improving the voltage resistance.

EXAMPLE 3

In this example, the surface of the $WSi_x$ formed by high temperature CVD was smoothed by a simultaneous sulfur deposition and etching of the $WSi_x$ layer using $S_2F_2$. This process is explained by referring to FIGS. 7a to 7d.

Figure 7A:
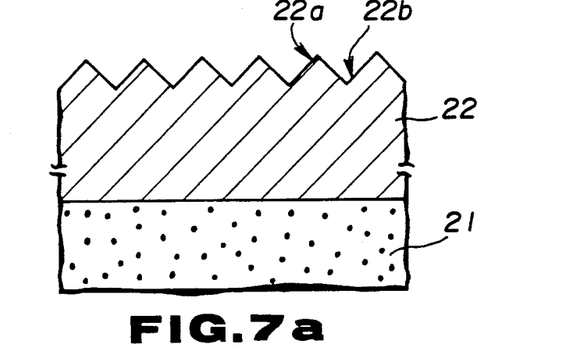

Referring to FIG. 7a, a wafer including a doped polysilicon layer 21 about 0.1 μm thick containing n-type impurities on which a $WSi_x$ layer 22 was formed to a thickness of approximately 0.1 μm by high temperature CVD was prepared. It is noted that the formation of a polycide gate electrode is contemplated and a thin gate oxide film not shown with a thickness of 0.01 μm is formed below the doped polysilicon layer 21. It is noted that the high temperature CVD is carried out using an LPCVD device under the conditions of the wafer temperature of 680° C., an $Si_2H_2Cl_2$ flow rate of 55 SCCM, a $WF_6$ flow rate of 1.2 SCCM and a gas pressure of 40 Pa (300 mTorr). Surface projections 22a and surface recesses 22b are present on the surface of the produced $WSi_x$ layer 22 and are shown highly schematically for exaggerating the surface projections and recesses.

Figure 7B:
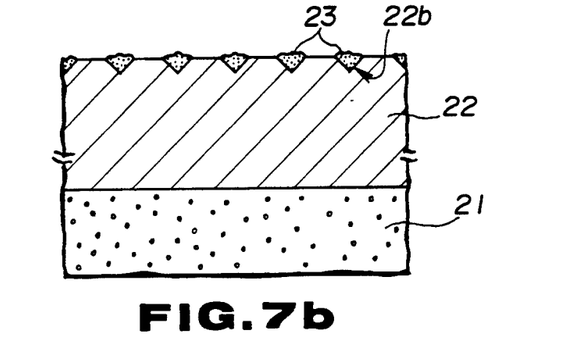
Figure 7C:
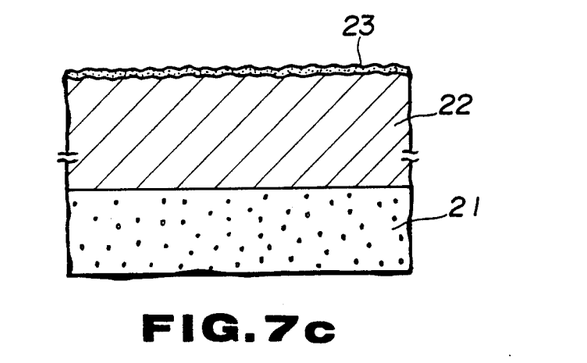

This wafer was set on a downflow type chemical dry etching device with a microwave frequency of 2.45 GHz and the surface thereof was smoothed under the conditions of an $S_2F_2$ flow rate of 50 SCCM, a gas pressure of 100 Pa and a wafer temperature of −70° C. Since no charged particles were incident on the wafer, etching may be performed without causing radiation damage. Under the above conditions, the process of forming a deposit layer 23 of sulfur by dissociation by electrical discharge in the surface recesses 22b and the process of removal of surface projections 22a by $F^*$ occurred competitively so that etching proceeded while the substrate surface was substantially planarized, as shown in FIG. 7b. After the initial surface roughnesses was substantially removed, the entire surface of the $WSi_x$ layer 22 was covered by the sulfur deposit layer 23.

Figure 7D:
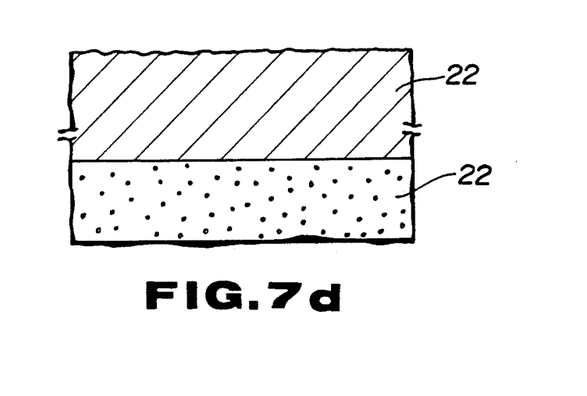

The deposit layer 23 was removed by sublimation by heating the wafer to 90° C. or higher after termination of the etching so that the $WSi_x$ layer, which was substantially freed of surface roughness and was substantially smoothed as shown in FIG. 7d, was ultimately produced.

The recent tendency is to use an extremely thin gate oxide film, not shown, for speeding up the MOS transistor operation. For this reason, it is necessary to etch the polycide film, that is the $WSi_x$ layer 22 and the doped polysilicon layer 21, under such condition that high selectivity against the thin gate oxide film is maintained. If etching is carried out while significant surface roughnesses as shown in FIG. 7a are left, the risk is high that the gate oxide film is injured during overetching. This inconvenience is eliminated by smoothing the surface of the $WSi_x$ layer 22 as explained above.

EXAMPLE 4

In this example, step differences formed on the surface of the interlayer insulating film covering the upper interconnection were planarized by a two step process consisting of a first step of depositing sulfur using $S_2F_2$ and a second step of etching the interlayer insulating film under different conditions again using $S_2F_2$. This process will be explained by referring to FIGS. 8a to 8d.

Figure 8A:
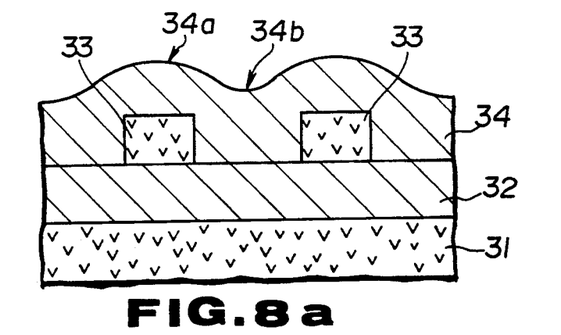

Referring first to FIG. 8a, a wafer, which was composed of an aluminum lower interconnection 31, a first interlayer insulating film of silicon oxide 32, an aluminum upper interconnection 33 and a second interlayer insulating film 34, stacked in this order, was prepared. It is noted that the interlayer insulating film 34 is smoothed to some extent by etching back along with an organic planarization layer, not shown. However, since there is a limit to the planarity obtained in this manner, stepped projections 34a and stepped recesses 34b are left on the surface as shown.

Figure 8B:
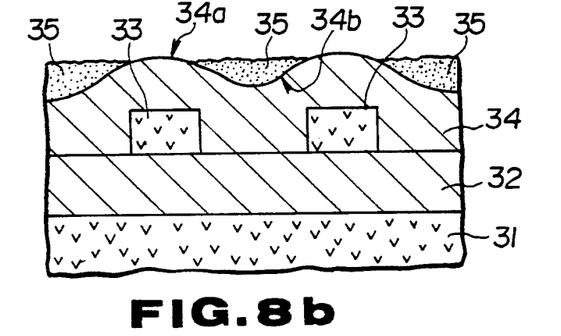

This wafer was set on a downflow type chemical dry etching device with a microwave frequency of 2.45 GHz and the microwave discharging was carried out under the conditions of an $S_2F_2$ flow rate of 50 SCCM, a gas pressure of 100 Pa and a wafer temperature of −70° C. As a result, sulfur yielded on dissociation by electrical discharge of $S_2F_2$ was deposited in the stepped recesses 34b to form a deposit layer 35 for substantially planarizing the substrate surface. The stepped projections 34a are scarcely etched because etching of silicon oxide mainly proceeds in the ion mode and the etchrate is retarded significantly since there are only neutral active species, such as $F^*$, which may be introduced into the etching chamber.

Figure 8C:
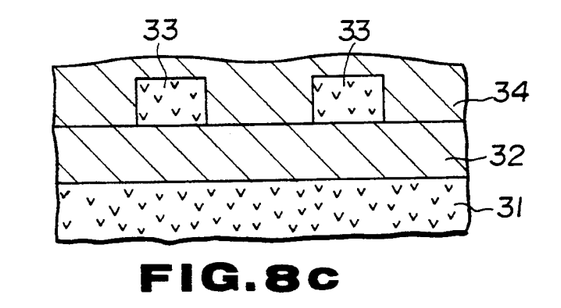

For planarizing the second interlayer insulating film 34, the wafer was transferred to a parallel planar electrode type RIE device, and etching was carried out under conditions of an $S_2F_2$ flow rate of 20 SCCM, a gas pressure of 1.3 Pa, a microwave power of 850 W and an RF power of 50 W (2 MHz). Under these conditions, the stepped projections 34a and the deposit layer 35 were etched simultaneously under the action of $S^+$, $S_2^+$, $SF_x^+$ or $F^*$, so that the surface of the second interlayer insulating layer 34 was substantially planarized, as shown in FIG. 8c.

Figure 8D:
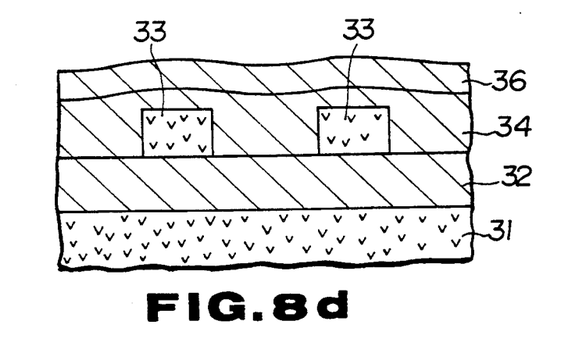

The sulfur deposit, not shown, remaining on the surface of the second interlayer insulating film 34, was removed on sublimation by heating the wafer. For making up for the reduced thickness of the second interlayer insulating film 34, the third interlayer insulating film 36 of silicon oxide was occasionally formed to a desired film thickness.

What is claimed is:

1. A dry etching method comprising the steps of providing a substrate having a layer of silicon-based material having a surface with surface projections and surface recesses; plasma etching said layer with an etching gas containing at least one compound selected from a group consisting of $S_2F_2$, $SF_2$, $SF_4$, $S_2F_{10}$, $S_3Cl_2$, $S_2Cl_2$ and $SCl_2$; and controlling the etching conditions to simultaneously deposit sulfur in surface recesses by regulating the etch temperature while etching away surface projections of said layer.

2. A dry etching method according to claim 1, wherein the step of controlling etching conditions controls the temperature of the substrate to be etched to have a temperature lower than ambient temperature.

3. A dry etching method according to claim 2, wherein the layer of silicon-based material is one selected from the group consisting of a single crystal silicon layer, a polysilicon layer and a refractive metal silicide layer.

4. A dry etching method according to claim 2, wherein the step of controlling the temperature uses a temperature of −70° C.

5. A dry etching method according to claim 1, wherein the layer of silicon-based material on the substrate is selected from the group consisting of a layer consisting of a single crystal silicon layer, a polysilicon layer, and a refractive metal silicide layer.

6. A dry etching method according to claim 1, wherein said step of controlling includes maintaining the temperature of the substrate below ambient temperature to cause a deposition of sulfur, and at the completion of the etching process, raising the temperature of the substrate to cause a removal of the sulfur.

7. A dry etching method according to claim 1, wherein the step of providing a substrate provides a substrate having a trench with sub-trenches at the base of the trench.

8. A dry etching method for forming a trench in a layer of silicon-based material, said method comprising the steps of providing a substrate having a layer of silicon-based material; plasma etching the layer to form a trench with an etching gas which produces sub-trenches adjacent the base of the trench; then plasma etching the layer with an etching gas containing at least one compound selected from a group consisting of $S_2F_2$, $SF_2$, $SF_4$, $S_2F_{10}$, $S_3Cl_2$, $S_2Cl_2$ and $SCl_2$; controlling the temperature of the substrate during the second plasma etching process to be below ambient temperature so that sulfur is deposited in the sub-trenches as the projections between the sub-trenches are being etched away and, subsequently, after completing the etching, removing any sulfur deposits therefrom.

* * * * *